United States Patent
Daves et al.

(10) Patent No.: US 9,871,025 B2
(45) Date of Patent: Jan. 16, 2018

(54) COMMUTATION CELL

(71) Applicant: Robert Bosch GmbH, Stuttgart (DE)

(72) Inventors: Walter Daves, Singapore (SG); Knut Alexander Kasper, Leonberg (DE); Martin Rittner, Freiberg (DE); Silvia Duernsteiner, Marbach A.N. (DE); Michael Guenther, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/308,287

(22) PCT Filed: Apr. 21, 2015

(86) PCT No.: PCT/EP2015/058559
§ 371 (c)(1),
(2) Date: Nov. 1, 2016

(87) PCT Pub. No.: WO2015/176893
PCT Pub. Date: Nov. 26, 2015

(65) Prior Publication Data
US 2017/0069608 A1   Mar. 9, 2017

(30) Foreign Application Priority Data
May 21, 2014  (DE) ................ 10 2014 209 690

(51) Int. Cl.
*H01L 25/16* (2006.01)
*H01L 23/498* (2006.01)
(Continued)

(52) U.S. Cl.
CPC ........ *H01L 25/16* (2013.01); *H01L 23/49833* (2013.01); *H01L 23/49838* (2013.01);
(Continued)

(58) Field of Classification Search
CPC ......... H01L 23/49833; H01L 23/49838; H01L 24/33; H01L 24/83; H01L 25/16;
(Continued)

(56) References Cited

U.S. PATENT DOCUMENTS

2007/0090814 A1   4/2007   Hashimoto et al.
2014/0299916 A1*  10/2014  Bourennane ...... H01L 21/82348
                                                          257/140

(Continued)

FOREIGN PATENT DOCUMENTS

| DE | 202013104510 U1 | 11/2013 |
|---|---|---|
| JP | 2005303018 A | 10/2005 |

(Continued)

OTHER PUBLICATIONS

International Search Report, dated Aug. 10, 2015, of the corresponding PCT Application PCT/EP2015/058559 filed Apr. 21, 2015.

*Primary Examiner* — Patrick O'Neill
(74) *Attorney, Agent, or Firm* — Norton Rose Fulbright US LLP; Gerard Messina

(57) ABSTRACT

A commutation cell having at least one electrical capacitor, at least one controllable semiconductor switch and at least one semiconductor which is connected in series with the controllable semiconductor switch. The commutation cell has three circuit substrates situated in parallel with one another. The controllable semiconductor switch is connected in series with the semiconductor via a circuit substrate situated partially between the controllable semiconductor switch and the semiconductor, and the two remaining circuit substrates being connected to one another in an electrically conductive manner via a subassembly made up of the controllable semiconductor switch, the semiconductor and the circuit substrate situated partially between the controllable semiconductor switch and the semiconductor, the (Continued)

electrical capacitor being switched between the two remaining circuit substrates, separately from the subassembly.

9 Claims, 2 Drawing Sheets

(51) Int. Cl.
  *H01L 23/00* (2006.01)
  *H03K 17/567* (2006.01)
(52) U.S. Cl.
  CPC .............. *H01L 24/33* (2013.01); *H01L 24/83* (2013.01); *H03K 17/567* (2013.01); *H01L 2224/29139* (2013.01); *H01L 2224/32225* (2013.01); *H01L 2224/33181* (2013.01); *H01L 2224/8384* (2013.01); *H01L 2924/0002* (2013.01)
(58) Field of Classification Search
  CPC . H01L 2224/29139; H01L 2224/32225; H01L 2224/33181; H01L 2224/8384; H03K 17/567

See application file for complete search history.

(56) References Cited

U.S. PATENT DOCUMENTS

| 2015/0123263 | A1* | 5/2015 | Frueh | ....................... | H01L 24/27 |
| | | | | | 257/734 |
| 2016/0043711 | A1* | 2/2016 | Cyr | ......................... | H02M 1/32 |
| | | | | | 318/400.22 |
| 2016/0218615 | A1* | 7/2016 | Senturk | .................... | H02M 1/34 |
| 2016/0285357 | A1* | 9/2016 | Cyr | .................. | H03K 17/08128 |
| 2016/0294275 | A1* | 10/2016 | Pronovost | ............ | H03K 17/166 |
| 2016/0301308 | A1* | 10/2016 | Amar | .................. | H03K 17/0828 |

FOREIGN PATENT DOCUMENTS

| JP | 2006134990 A | 5/2006 |
| WO | 2013167321 A1 | 11/2013 |

\* cited by examiner

COMMUTATION CELL

BACKGROUND INFORMATION

Commutation cells are parts of electrical circuits which, for instance, are installed in washing machines, fan-type ventilators, electrical power steering systems and electrical drives of motor vehicles.

FIG. 1 shows an exemplary embodiment of a conventional commutation cell 1, in which a current modification initiated by a switching operation may come about. Commutation cell 1 includes a controllable semiconductor switch 2 as well as a semiconductor diode 3, which is connected in series with the controllable semiconductor switch. An electric potential at a dynamic node 4 is modified with the aid of commutation cell 1. The physical realization of commutation cell 1 is defined by the geometry and other properties of the electrical components that are used for its development, and by circuit traces of commutation cell 1. Commutation cell 1 forms a conductor loop 5, which generates parasitic inductances in commutation cell 1 that are indicated schematically by electrical components 6. These parasitic inductances are created by the respective development of the electrical components and by the respective packaging of commutation cell 1.

Typically, conventional commutation cells are made up of electrical components that are situated next to one another on a circuit substrate, as in the placement shown in FIG. 1, for example. Because of wiring elements such as bonding wires and required clearances between the electrical components, especially for heat distribution, conventional commutation cells have high parasitic inductances.

SUMMARY

The subject matter of the present invention is a commutation cell including at least one electrical capacitor, at least one controllable semiconductor switch and at least one semiconductor connected in series with the controllable semiconductor switch, and it is characterized by three circuit substrates situated in parallel with one another, the controllable semiconductor switch being connected in series with the semiconductor via a circuit substrate situated partially between the controllable semiconductor switch and the semiconductor, the two remaining circuit substrates being connected to each other in an electrically conductive manner via a subassembly made up of the controllable semiconductor switch, the semiconductor, and the circuit substrate situated partially between the controllable semiconductor switch and the semiconductor, and the electrical capacitor being connected between the two remaining circuit substrates, separately from the subassembly.

In the commutation cell according to the present invention, the electrical components are not situated next to one another on a circuit substrate in the conventional manner. Moreover, no normally required wiring elements such as bonding wires, and usually required clearances, in particular for heat distribution, are provided between the electrical components. As a result, the present invention provides a commutation cell that is very compact in comparison to conventional commutation cells, thereby resulting in a minimization of the enclosed conductor loop and therefore, of the associated parasitic inductances. The commutation cell according to the present invention thus has three wiring planes which are situated on top of one another. The use of simple materials for the circuit substrates, such as copper, additionally results in cost advantages in comparison to conventional commutation cells. Moreover, the commutation cell according to the present invention has optimal heat dissipation characteristics since double-sided cooling and heat dissipation is possible in the vicinity of an electrical component that generates heat during its operation. Better heat dissipation characteristics may provide greater efficiency and, in particular, higher power densities, and thereby allow better utilization of materials.

The circuit substrates may be developed as lead frames, circuit boards, laminates, AMB (active metal braze) substrates, DCB (direct copper bonded) substrates, traces or the like. The respective clearance between the circuit substrates is limited by the dimensions of the controllable semiconductor switch, the joint gap and the semiconductor.

It is possible to develop the semiconductor as a passive semiconductor, e.g., as a semiconductor diode, or also as a controllable semiconductor switch.

The electrical capacitor may be developed as a ceramic multilayer chip capacitor (MLCC) or also as a multilayer silicon-on-insulator (SOI) capacitor, the latter being advantageous with regard to a compact development of a commutation cell according to the present invention.

According to one advantageous development, the commutation cell has two commutation cell parts, which have basically the same physical design and can be connected to each other; the circuit substrate, which is situated partially between the controllable semiconductor switch and the semiconductor, includes two circuit substrate parts that are able to be placed in parallel with and connected to each other, and the electrical capacitor includes two electrodes, the one commutation cell part being made up of the one circuit substrate part, the one electrode of the electrical capacitor, the controllable semiconductor switch and one of the remaining circuit substrates, and the other commutation cell part being formed by the other circuit substrate part, the other electrode of the electrical capacitor, the semiconductor and the other one of the remaining circuit substrates. Prior to their interconnection, the two commutation cell parts may be checked with regard to their proper functioning. The use of two commutation cell parts that can be connected to each other minimizes an assembly risk of a blind assembly, especially because the individual commutation cell parts have a two-sided design and are subsequently connected to each other through a simple assembly step. A two-sided design of a commutation cell part also results in complete accessibility during an assembly and inspection process. Moreover, in comparison with conventional complex manufacturing processes, this design results in cost advantages because of the relatively simple connection of two commutation cell parts so as to form a commutation cell.

According to one further advantageous development, the circuit substrate parts and the electrodes of the electrical capacitor are connected to one another via a respective joining layer formed with the aid of a joining method. This constitutes a common and established packaging technology that simplifies the production of the commutation cell. For example, a soldering method, especially soft soldering, conductive bonding, sintering, in particular silver sintering, or the like may be used as joining method. All of these joining methods have in common that they may be employed to create a metallic contact between components to be joined.

In one further advantageous development, a respective joining layer developed by a joining method is situated between the interconnected electrical components of at least one commutation cell part. For example, if a soldering method is selected as joining method, and if a commutation cell part developed in this way is to be connected to the respective other commutation cell part via a soldering method as well in order to form the commutation cell, then it will be necessary to mutually adapt the characteristics of the solders used for developing the commutation cell part, for one, and the commutation cell, for another. A solder hierarchy must be observed for solders; when the commutation cell parts are connected using a soldering method, this hierarchy prevents renewed melting and leaching of the joining layers of the at least one commutation cell part in which a respective joining layer, created by a soldering method, is developed between the interconnected electrical components. When employing joining methods via the mechanism of solid body diffusion such as diffusion soldering or sintering, for example, attention must be paid to a suitable metallization and a suitable construction that is able to apply an auxiliary joining pressure.

In addition, it is considered advantageous if a respective joining layer, developed using a silver sintering method, is situated between interconnected electrical components of at least one commutation cell part. This is advantageous in that a joining material created by a silver sintering method does not melt at a joining temperature of approximately 250 to 300 degrees Celsius that is typical of a soldering method, but remains in the solid state. Therefore, it is not necessary to adapt different solders to one another, in the manner described for the previously mentioned development, in order to prevent the joining layers of the individual commutation cell parts from melting when the two commutation cell parts are connected.

In an advantageous manner, at least one spacer element is situated in at least one joining layer. This creates greater design freedom in the development of a commutation cell, since a commutation cell, to a certain degree, can be designed independently of the respective geometry of the electrical capacitor, the controllable semiconductor switch, and/or the semiconductor. Even two or more spacer elements may be situated in a joining layer.

According to another advantageous development, at least one compensating element for compensating for different coefficients of thermal expansion of the electrical components connected to one another via the joining layers is provided in at least one joining layer. For example, the compensating element may be made from molybdenum. The compensating element may simultaneously also be used as spacer element. Moreover, it is also possible to place two or more compensating elements in a joining layer.

According to one further advantageous development, the commutation cell has an external electrical insulation. The external electrical insulation may be realized by a casting or a second cast. Such a casting or second cast may also be used to create sufficient mechanical stability of a commutation cell and to satisfy requirements with regard to the moisture sensitivity threshold value (moisture sensitivity level/MSL), which is a measure for the loading capacity of the circuit by environmental effects. The exclusive provision of an external electrical insulation on a commutation cell allows maximum heat distribution in close proximity to the electrical components of the commutation cell. The electrical insulation may also include TIMs (thermal interface material). As an alternative, a circuit substrate may be developed as a ceramics-metal composite.

In addition, it is considered advantageous if the commutation cell includes at least one electronic control unit for controlling the controllable semiconductor switch. The electronic control unit may be connected to the controllable semiconductor switch and/or to the semiconductor on which the electronic control unit is situated, via a conventional bonding technology or via at least one circuit substrate.

Below, the present invention is explained by way of example with reference to the appended figures on the basis of preferred exemplary embodiments; the features shown hereinafter may represent a particular aspect of the present invention both on their own and in different combinations.

DETAILED DESCRIPTION OF EXAMPLE EMBODIMENTS

Figure 1:
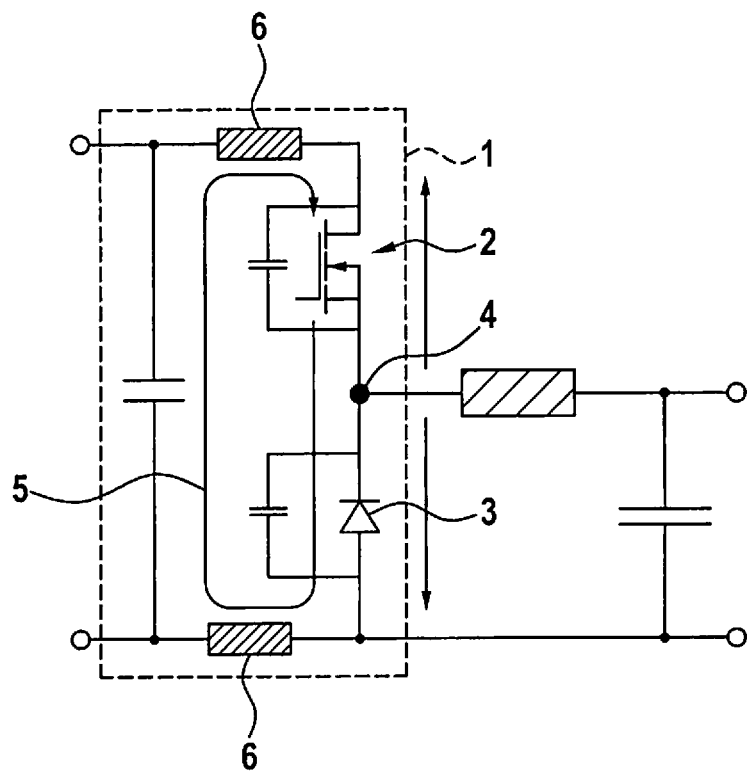
FIG. 1 shows a circuit diagram of a conventional commutation cell.
Figure 2:
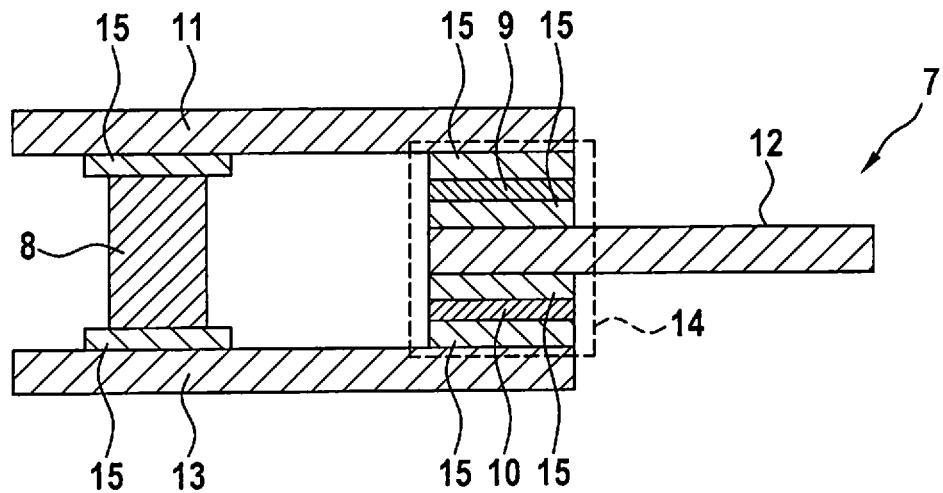
FIG. 2 shows a schematic sectional view of an exemplary embodiment for a commutation cell according to the present invention.

FIG. 2 shows a schematic representation of an exemplary embodiment for a commutation cell 7 according to the present invention. Commutation cell 7 has an electrical capacitor 8, a controllable semiconductor switch 9, and a semiconductor 10, which is connected in series with controllable semiconductor switch 9. In addition, commutation cell 7 has three circuit substrates 11, 12 and 13 situated in parallel with one another, the controllable semiconductor switch 9 being switched in series with semiconductor 10 via a circuit substrate 12 that is partially situated between controllable semiconductor switch 9 and semiconductor 10. The two remaining circuit substrates 11 and 13 are connected to each other in an electrically conductive manner via a subassembly 14 made up of controllable semiconductor switch 9, semiconductor 10 and circuit substrate 12 partially situated between controllable semiconductor switch 9 and semiconductor 10. Electrical capacitor 8 is switched between the two remaining circuit substrates 11 and 13, separately from subassembly 14. A respective joining layer 15, formed by a joining method, is situated between interconnected electrical components 8 through 13 of commutation cell 7.

Figure 3:
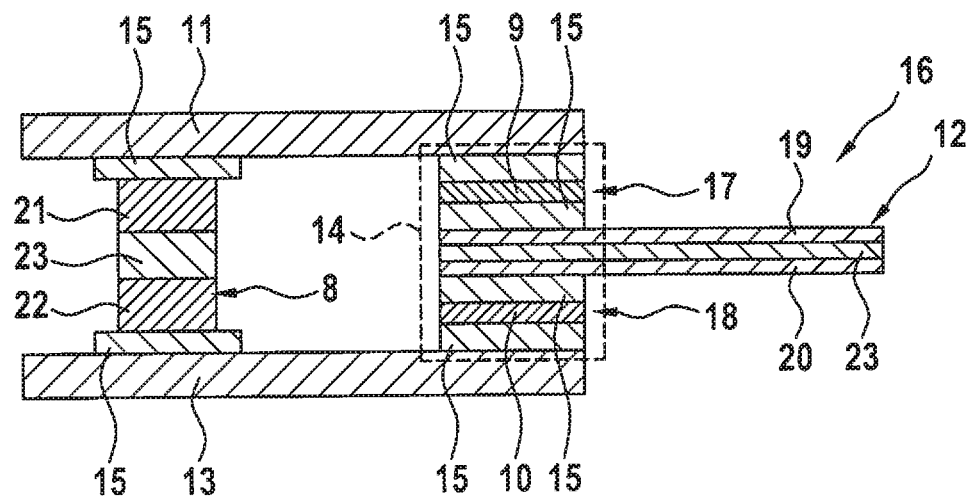
FIG. 3 shows a schematic sectional view of a further exemplary embodiment for a commutation cell according to the present invention.
Figure 4:
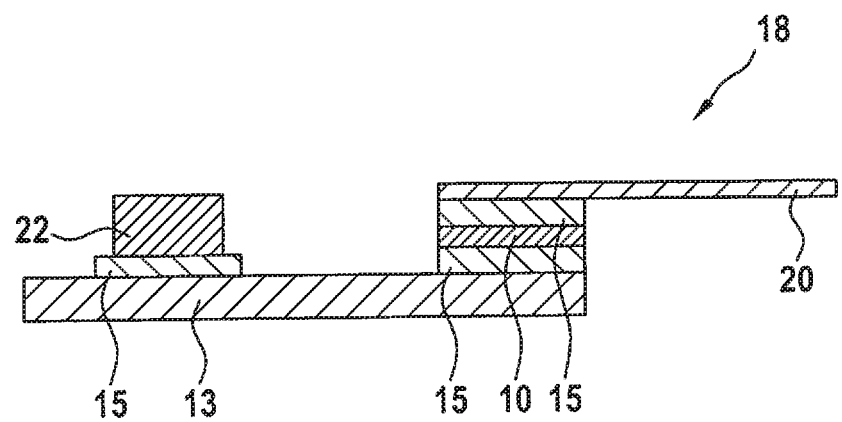
FIG. 4 shows a schematic sectional view of a commutation cell part of the commutation cell shown in FIG. 3.

FIG. 3 shows a schematic sectional view of a further exemplary embodiment of a commutation cell 16 according to the present invention, which differs from the exemplary embodiment shown in FIG. 2 in particular by having two commutation cell parts 17 and 18, which are basically identical in their physical design and are able to be connected to each other. Circuit substrate 12, via which controllable semiconductor switch 9 is connected in series with semiconductor 10, has two circuit substrate parts 19 and 20, which are situated in parallel with each other, and electrical capacitor 8 has two electrodes 21 and 22. The one commutation cell part 17 is formed by circuit substrate part 19, electrode 21 of electrical capacitor 8, controllable semiconductor switch 9, and circuit substrate 11; and the other commutation cell part 18 is formed by circuit substrate part 20, electrode 22 of electrical capacitor 8, semiconductor 10, and circuit substrate 13. Circuit substrate parts 19 and 20 and electrodes 21 and 22 of electrical capacitor 8 are connected to each other via a respective joining layer 23 formed by a joining method. A respective joining layer 15, which is developed with the aid of a joining method adapted to the previously mentioned joining method, is situated between respective interconnected electrical components 9, 11, 15, 19 and 21, and 10, 13, 15, 20 and 22 of commutation cell parts 17 and 18.

What is claimed is:

1. A commutation cell, comprising:
   at least one electrical capacitor;
   at least one controllable semiconductor switch; and
   at least one semiconductor connected in series with the controllable semiconductor switch;
   three circuit substrates situated in parallel with one another, the controllable semiconductor switch being connected in series with the semiconductor via one of the circuit substrates which is partially situated between the controllable semiconductor switch and the semiconductor, the two remaining ones of the circuit substrates being connected to each other in an electrically conductive manner via a subassembly made up of the controllable semiconductor switch, the semiconductor and the one of the circuit substrates partially situated between the controllable semiconductor switch and the semiconductor, and the electrical capacitor being connected between the two remaining ones of the circuit substrates, separately from the subassembly.

2. The commutation cell as recited in claim 1, further comprising:
   two commutation cell parts which are the same in their physical design and are connected to each other, wherein the one of the circuit substrates, via which the controllable semiconductor switch is connected in series with the semiconductor, has two circuit substrate parts which are situated in parallel with and connected to each other, and the electrical capacitor includes two electrodes, and wherein one of the commutation cell parts is formed by one of the circuit substrate parts, one of the electrodes of the electrical capacitor, the controllable semiconductor switch, and one of the remaining ones of the circuit substrates, and wherein the other one of the commutation cell parts is formed by the other one of the circuit substrate parts, the other one of the electrodes of the electrical capacitor, the semiconductor, and the other one of the remaining ones of the circuit substrates.

3. The commutation cell as recited in claim 2, wherein the circuit substrate parts and the electrodes of the electrical capacitor are connected to each other via a respective joining layer developed with the aid of a joining method.

4. The commutation cell as recited in claim 3, wherein at least one spacer element is situated in at least one joining layer.

5. The commutation cell as recited in claim 3, wherein at least one compensating element is situated in at least one joining layer to compensate for different coefficients of thermal expansion of the electrical components connected to one another via the joining layer.

6. The commutation cell as recited in claim 2, wherein a respective joining layer, created with the aid of a joining method, is situated between the interconnected electrical components of at least one of the commutation cell parts.

7. The commutation cell as recited in claim 2, wherein a respective joining layer, created by a silver sintering method, is situated between the interconnected electrical components of at least one of the commutation cell parts.

8. The commutation cell as recited in claim 1, further comprising:
   an external electrical insulation.

9. The commutation cell as recited in claim 1, further comprising: at least one electronic control unit for controlling the controllable semiconductor switch.

* * * * *